(12) United States Patent
Gustavsson

(10) Patent No.: US 9,369,093 B2
(45) Date of Patent: Jun. 14, 2016

(54) RADIO FREQUENCY POWER AMPLIFIER NON-LINEARITY COMPENSATION

(71) Applicant: Telefonaktiebolaget L M Ericsson (publ), Stockholm (SE)

(72) Inventor: Ulf Gustavsson, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 82 days.

(21) Appl. No.: 14/492,828

(22) Filed: Sep. 22, 2014

(65) Prior Publication Data

US 2015/0326190 A1    Nov. 12, 2015

(30) Foreign Application Priority Data

Sep. 27, 2013    (EP) .................................... 13186364

(51) Int. Cl.
| | |
|---|---|
| *H03F 1/26* | (2006.01) |
| *H03F 1/32* | (2006.01) |
| *H03F 3/19* | (2006.01) |
| *H03F 3/21* | (2006.01) |
| *H04B 1/04* | (2006.01) |
| *H03F 3/195* | (2006.01) |
| *H03F 3/24* | (2006.01) |

(52) U.S. Cl.
CPC ................ *H03F 1/3241* (2013.01); *H03F 3/19* (2013.01); *H03F 3/195* (2013.01); *H03F 3/21* (2013.01); *H03F 3/245* (2013.01); *H04B 1/0475* (2013.01); *H03F 1/26* (2013.01); *H03F 2200/451* (2013.01); *H03F 2201/3215* (2013.01); *H03F 2201/3224* (2013.01); *H03F 2201/3233* (2013.01); *H04B 2001/0425* (2013.01)

(58) Field of Classification Search
CPC ............... H03F 1/3247; H03F 1/3258; H03F 2200/451; H03F 3/24; H03F 1/26; H03F 1/3241; H03F 3/195; H03F 1/3294; H03F 2200/336; H03F 2201/3224; H03F 3/245; H03F 2201/3209; H03F 3/19; H03F 2201/3233
USPC ............................... 330/149; 455/63.1, 114.3
See application file for complete search history.

(56) References Cited

U.S. PATENT DOCUMENTS

| | | | | |
|---|---|---|---|---|
| 6,801,086 | B1 * | 10/2004 | Chandrasekaran ... | H03F 1/3247 330/140 |
| 7,773,692 | B2 * | 8/2010 | Copeland .............. | H03F 1/3247 375/297 |
| 9,025,575 | B2 * | 5/2015 | McGowan .......... | H04W 72/082 370/336 |
| 9,100,263 | B2 * | 8/2015 | Utsunomiya ......... | H04L 27/368 |
| 2008/0130789 | A1 * | 6/2008 | Copeland .............. | H03F 1/3247 375/297 |
| 2013/0113559 | A1 * | 5/2013 | Koren ................... | H03F 1/0222 330/149 |

FOREIGN PATENT DOCUMENTS

WO    2006021224 A1    3/2006

OTHER PUBLICATIONS

Degen, C. M. et al., "Adaptive MIMO Techniques for the UTRA-TDD Mode", IEEE VTS 53rd Vehicular Technology Conference (VTC 2001 Spring), vol. 1, May 6-9, 2001, pp. 108-112.
Fischer, Robert F. et al., "Improved MIMO Precoding for Decentralized Receivers Resembling Concepts from Lattice Reduction", IEEE Global Telecommunications Conference (GLOBECOM '03), vol. 4, Dec. 1-5, 2003, pp. 1852-1856.
Zhu, Anding et al., "Dynamic Deviation Reduction-Based Volterra Behavioral Modeling of RF Power Amplifiers", IEEE Transactions on Microwave Theory and Techniques, vol. 54, No. 12, Dec. 2006, pp. 4323-4332.

* cited by examiner

*Primary Examiner* — Khanh V Nguyen
(74) *Attorney, Agent, or Firm* — Murphy, Bilak & Homiller, PLLC

(57) ABSTRACT

There is provided compensation for non-linear effects caused by a radio frequency power amplifier. An input sequence is acquired. A pre-distortion parameter is determined based on the input sequence. The pre-distortion parameter is based on a block matrix pseudo-inverse of a regression matrix comprising permutations of the input sequence. The regression matrix is decomposed into at least two block matrices based on at least one physical property of the radio frequency power amplifier.

14 Claims, 4 Drawing Sheets

RADIO FREQUENCY POWER AMPLIFIER NON-LINEARITY COMPENSATION

RELATED APPLICATION

This application claims priority from European Patent Application no. EP13186364.9, filed 27 Sep. 2013, the entire contents of which are incorporated herein by reference.

TECHNICAL FIELD

Embodiments presented herein relate to non-linearity in a radio frequency power amplifier, and particularly to a method, a pre-distorter, a computer program, and a computer program product for compensating for nonlinear effects caused by the radio frequency power amplifier.

BACKGROUND

In mobile communication networks, there is always a challenge to obtain good performance and capacity for a given communications protocol, its parameters and the physical environment in which the mobile communication network is deployed.

One component in a mobile communication network is the network node. In general terms, a network node facilitates wireless communication between a wireless electronic device and a network. In order to do so the network node comprises hardware as well as software. A transceiver unit is responsible for transmission and reception of radio signals. The signals to be transmitted from the transceiver unit are provided to a radio frequency power amplifier (RFPA) which amplifies the signals from the transceiver unit before being fed to an antenna. The RFPA may be integrated with the transceiver unit. RFPA are highly nonlinear elements which commonly inflicts distortion on to the signal when driven in compression. In order to compensate for this, a pre-distorter may be used in order to cancel out the distortion added by the RFPA. For this purpose it is common to use a black-box model of the RFPA to model and invert the distortion components.

Known models for digital pre-distortion are very often based on different variants of the Volterra-series, or memory polynomials. On example of the first approach is by Zhu, A. et al; "*Dynamic Deviation Reduction-Based Volterra Behavioral Modeling of RF Power Amplifiers*", IEEE Transactions on Microwave Theory and Techniques, 2006. One example of the second approach is by Morgan, D. R et al; "*A generalized memory polynomial model for digital predistortion of RF power amplifiers*", IEEE Transactions on Signal Processing.

Since most of the known models are linear in parameters, they may be described in a matrix form as $$y = H\theta + w,$$

where H is the N-by-M basis regression matrix which consists of permutations on the input x, $\theta$ is the M-by-1 model coefficient vector, y is the N-by-1 vector containing the output samples from the RFPA and w is the N-by-1 observation noise vector. For simplicity, the observation noise is commonly assumed to be additive and Gaussian. In the noise-less case, one step of the Gauss-Newton iteration yields the least squares error optimal coefficient vector $\theta_{LS}$ as $$\theta_{LS} = (H^T H)^{-1} H^T y,$$

where y is a vector containing the observations made at the RFPA output. From the equation immediately above, the Moore-Penrose pseudo inverse is identified as $$H^+ = (H^T H)^{-1} H^T.$$

Since noiseless observations are impossible in practice, the Gauss-Newton-step (GNS) may require several iterations in order to converge, which is done iteratively as $$\theta^{(n+1)} = \theta^{(n)} + \mu H^+(x-y),$$

where $\alpha < 1$ is the step-size and $\theta^{(n)}$ is the coefficient vector at the n:th iteration.

However, there is still a need for an improved determination of the non-linearity of RFPAs in network nodes.

SUMMARY

An object of embodiments herein is to provide improved determination of the non-linearity of RFPAs in network nodes.

The inventors of the enclosed embodiments have through a combination of practical experimentation and theoretical derivation discovered that one issue with the above mentioned approaches is the need of computing the pseudo inverse of a sufficiently large (i.e., "tall") matrix, where the dimensions of the matrix corresponds to the number of parameter times the number of samples. The numerical computation of the pseudo-inverse may be performed by using the Singular Value Decomposition (SVD), which is defined as $$H = UDV^T,$$

where U is a upper diagonal matrix, V is a lower diagonal matrix and $D = \text{diag}(\sigma_1, \ldots, \sigma_M)$, where $\sigma_1, \ldots, \sigma_M$ are the singular values of the matrix H. After computing the SVD, the Moore-Penrose pseudo inverse, $H^+$, may be determined as $$H^+ = UD^+V^T,$$

where $D^+ = \text{diag}(1/\sigma_1, \ldots, 1/\sigma_M)$, U and V are matrices containing the eigenvectors for $H^T H$ and $HH^T$, respectively. The condition number of H, denoted $\kappa(H)$, determines the accuracy in which H can be pseudo-inverted (e.g. the uncertainty of the solutions given by the least-squares problem) may be determined according to $$\kappa(H) = \frac{\max(\sigma_i)}{\min(\sigma_i)},$$

where $1 \leq i \leq M$. In general terms, the condition number of H determines the accuracy of the approximate solution of the linear estimation problem (e.g., $\theta$). This accuracy can be bounded using the Cramer-Rao Lower Bound (CRLB). Since $\theta_{LS}$ as defined above is a minimum variance unbiased estimator which achieves the CRLB, the CRLB may be determined by calculating the parameter covariance matrix $$C_{\theta_{LS}} = \sigma_w^2 (H^T H)^{-1},$$

where $\sigma_w^2$ is the observation noise-power. Generally, either reducing the number of parameters or the number of samples in a linear model, decreases the variance of the estimate since $H^T H$ is positive definite. However, as dictated by CRLB, one would like to take as many samples as possible in order to reduce the variance of the parameter estimate, which further causes the numerical problem to increase in size.

A particular object is therefore to improved determination of the non-linearity of RFPAs in network nodes using less computational complexity than the above mentioned approaches.

According to a first aspect there is presented a method for compensating for non-linearity in a radio frequency power amplifier, RFPA. The method is performed by a pre-distorter.

The method comprises acquiring an input sequence x. The method comprises determining a pre-distortion parameter θ based on the input sequence. The pre-distortion parameter is based on a block matrix pseudo-inverse $H^+$ of a regression matrix H comprising permutations of the input sequence. The regression matrix is decomposed into at least two block matrices $H_1$, $H_2$ based on at least one physical property of the RFPA.

Advantageously this enables the use of a block-matrix description of H, where each block matrix can be determined according to the model in use. Determination of the non-linearity of RFPAs in network nodes may thus be improved by solving smaller partial problems instead of one larger problem.

Advantageously, due to the reduced dimensionality of each sub-problem associated with the determination of each block matrix, the final solution for the pre-distortion parameter becomes more accurate and stable. In other words, dividing a linear problem into two or more linear problems with lesser dimension will provide a more accurate estimate of the pre-distortion parameter.

Advantageously, solving a large numerical problem by splitting it up into several, smaller, problems also allows parallel computing power to be used.

According to a second aspect there is presented a pre-distorter for compensating for non-linearity in a radio frequency power amplifier, RFPA. The pre-distorter comprises a processing unit. The processing unit is arranged to acquire an input sequence. The processing unit is arranged to determine a pre-distortion parameter θ based on the input sequence. The pre-distortion parameter is based on a block matrix pseudo-inverse $H^+$ of a regression matrix H comprising permutations of the input sequence. The regression matrix is decomposed into at least two block matrices $H_1$, $H_2$ based on at least one physical property of the RFPA.

According to a third aspect there is presented a network node. The network node comprises a pre-distorter according to the second aspect and a RFPA. An output of the pre-distorter is operatively connected to an input of the RFPA.

According to a fourth aspect there is presented a computer program for compensating for non-linearity in a radio frequency power amplifier, the computer program comprising computer program code which, when run on a pre-distorter, causes the pre-distorter to perform a method according to the first aspect.

According to a fifth aspect there is presented a computer program product comprising a computer program according to the fourth aspect and a computer readable means on which the computer program is stored.

It is to be noted that any feature of the first, second, third, fourth and fifth aspects may be applied to any other aspect, wherever appropriate. Likewise, any advantage of the first aspect may equally apply to the second, third, fourth, and/or fifth aspect, respectively, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature in dashed lines should be regarded as optional.

Figure 1:
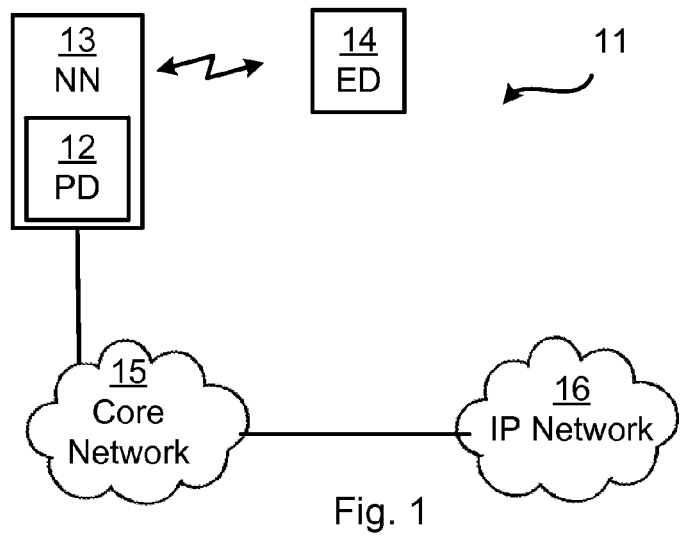
FIG. 1 is a schematic diagram illustrating a communications network according to embodiments.

FIG. 1 shows a schematic overview of an exemplifying communications system 11 where embodiments presented herein can be applied. The communications system 1 comprises a network node (NN) 13, which is providing network coverage over cells (not shown). The network node 13 may be any of a base transceiver station (BTS), a Node B (NB), or an E-UTRAN Node B, also known as Evolved Node B, (eNodeB or eNB). In general terms, the network node 13 facilitates wireless communication between the wireless electronic device (ED) 14 and a network. In order to do so, the network node 13 comprises hardware as well as software. A transceiver unit is responsible for transmission and reception of radio signals. The signals to be transmitted from the transceiver unit are provided to a radio frequency power amplifier (RFPA) which amplifies the signals from the transceiver unit before being fed to an antenna. The RFPA may be integrated with the transceiver unit.

The power amplifiers may be required to be "linear", in that it should accurately reproduce the signal presented at its input. In general terms, an amplifier that compresses its input or has a non-linear input/output relationship causes the output signal to leak onto adjacent radio frequencies (cf. adjacent channel leakage ratio, ACLR). This causes interference on other radio channels. The network node 13 therefore comprises a pre-distorter (PD) 12. In general terms, the PD 12 aims at inversely modeling the RFPA's gain and phase characteristics and, when combined with the PD, aims at producing an overall system that is more linear and reduces the PA's distortion. In essence, the PD 12 is based on the principle of estimating and applying the inverse nonlinear function of the RFPA, thereby cancelling any non-linear distortion effects of the RFPA, which in turn assures minimal disturbance on neighboring channels. The PD 12 will be further disclosed below.

As is known by the skilled person, the network node 13 may comprise further units, such as a combiner for combining signals from at least two transceiver units to one antenna, a duplexer for separating transmission signals from reception signals, a control unit for controlling the functionality of the network node 13, etc.

A user equipment (UE) in the form of a wireless electronic device (ED) 14 positioned in a particular cell is thus provided network service by the network node 13 serving that particular cell. Examples of wireless EDs 14 include, but are not limited to mobile phones, tablet computers, laptop computers, and stationary computers. As the skilled person understands, the communications system 11 may comprise a plurality of network nodes 13 and a plurality of EDs 14 operatively connected to at least one of the plurality of network nodes 13. The network node 13 is operatively connected to a core network 15. The core network 15 may provide services and data to the wireless ED 14 operatively connected to the network node 13 from an external Internet Protocol (IP) packet switched data network 16. At least parts of the communications system 11 may generally comply with any one or a combination of W-CDMA (Wideband Code Division Multiplex), LTE (Long Term Evolution), EDGE (Enhanced Data Rates for GSM Evolution, Enhanced GPRS (General Packet Radio Service)), CDMA2000 (Code Division Multiple Access 2000), WiFi, microwave radio links, High Speed Packet Access (HSPA), etc., as long as the principles described hereinafter are applicable.

The embodiments disclosed herein relate to compensating for nonlinear effects caused by a radio frequency power amplifier. In order to obtain such compensation there is provided a pre-distorter, a method performed by the pre-distorter, a computer program comprising code, for example in the form of a computer program product, that when run on a pre-distorter causes the pre-distorter to perform the method.

Figure 2A:
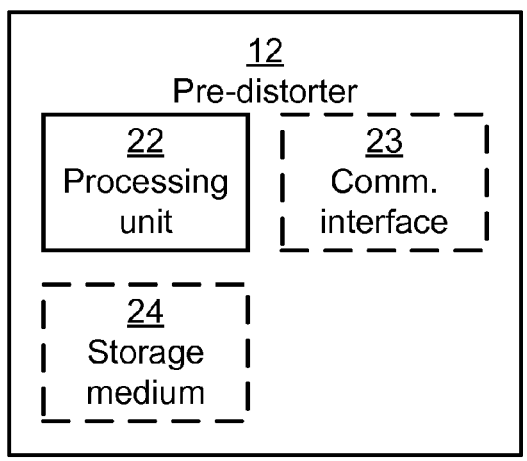
FIG. 2a is a schematic diagram showing functional modules of a pre-distorter according to an embodiment.

FIG. 2a schematically illustrates, in terms of a number of functional modules, the components of a pre-distorter 12 according to an embodiment. A processing unit 22, which may alternatively be referred to as a "processing circuit," is provided using any combination of one or more of a suitable central processing unit (CPU), multiprocessor, microcontroller, digital signal processor (DSP), application specific integrated circuit (ASIC), field programmable gate arrays (FPGA) etc., capable of executing software instructions stored in a computer program product 41 (as in FIG. 4), e.g. in the form of a storage medium 24. Thus the processing unit 22 is thereby arranged to execute methods as herein disclosed. The storage medium 24 may also comprise persistent storage, which, for example, can be any single one or combination of magnetic memory, optical memory, solid state memory or even remotely mounted memory. The pre-distorter 12 may further comprise a communications interface 23 for receiving and providing signals and parameters to other devices operatively connected to the pre-distorter 12. The processing unit 22 controls the general operation of the pre-distorter 12, e.g. by sending data and control signals to the communications interface 23 and the storage medium 24, by receiving data and reports from the communications interface 23, and by retrieving data and instructions from the storage medium 24. Other components, as well as the related functionality, of the pre-distorter 12 are omitted in order not to obscure the concepts presented herein.

Figure 2B:
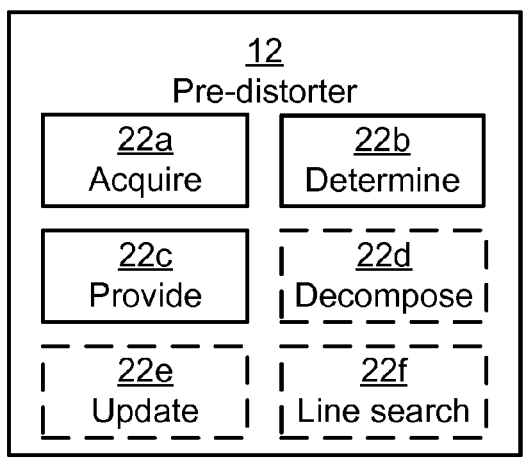
FIG. 2b is a schematic diagram showing functional units of a pre-distorter according to an embodiment.

FIG. 2b schematically illustrates, in terms of a number of functional units, the components of a pre-distorter 12 according to an embodiment. The pre-distorter 12 of FIG. 2b comprises a number of functional units; an acquiring unit 22a, a determining unit 22b, and a providing unit 22c. The pre-distorter 12 of FIG. 2b may further comprises a number of optional functional units, such as any of a decomposing unit 22d, an updating unit 22e, and a line searching unit 22f. The functionality of each functional unit 22a-f will be further disclosed below in the context of which the functional units may be used. The processing unit 22 may thus be arranged to from the storage medium 24 fetch instructions as provided by a functional unit 22a-f and to execute these instructions, thereby performing any steps as will be disclosed hereinafter. In general terms, each functional unit 22a-f may be implemented in hardware or in software; functional units implemented using hardware (including those that use programmable circuits, such as a microprocessor configured with appropriate program instructions stored in a storage medium) may be referred to as "circuits"; thus, acquiring unit 22a, determining unit 22b, and providing unit 22c may be understood to be an acquiring circuit, a determining circuit, and a providing circuit, respectively, in some embodiments.

Figure 3:
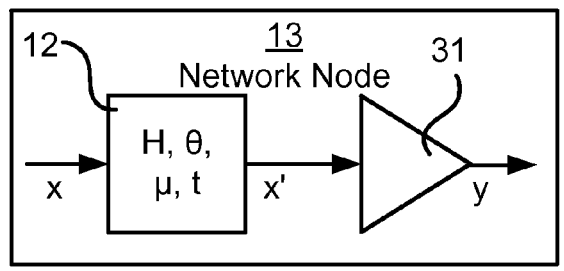
FIG. 3 is a schematic diagram of a network node according to an embodiment.

The pre-distorter 12 may be provided as a standalone device or as a part of a further device. For example, the pre-distorter 12 may be provided in a network node 13. FIG. 3 illustrates a network node 13 comprising at least one pre-distorter 12 as herein disclosed. The pre-distorter 12 may be provided as an integral part of the network node 13. That is, the components of the pre-distorter 12 may be integrated with other components of the network node 13; some components of the network node 13 and the pre-distorter 12 may be shared. For example, if network node 13 as such comprises a processing unit, this processing unit may be arranged to perform the actions of the processing unit 22 associated with the pre-distorter 12. Alternatively the pre-distorter 12 may be provided as a separate unit in the network node 13. The network node 13 may be a BTS, a NodeB, an eNB, or the like. The network node 13 further comprises an RFPA 31 with functionality as disclosed above.

Figure 4:
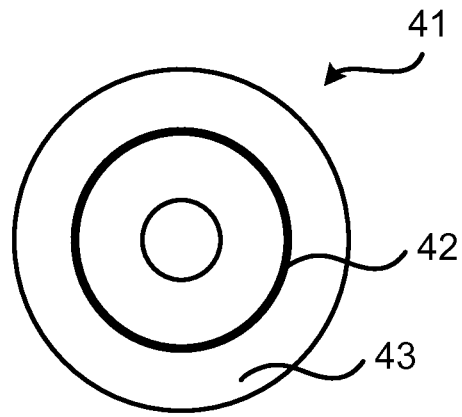
FIG. 4 shows one example of a computer program product comprising computer readable means according to an embodiment.
Figure 5:
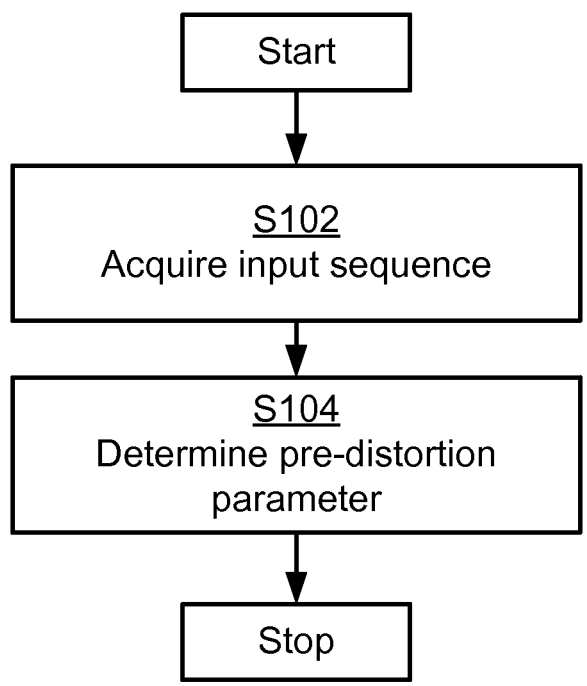
FIGS. 5 and 6 are flowcharts of methods according to embodiments.
Figure 6:
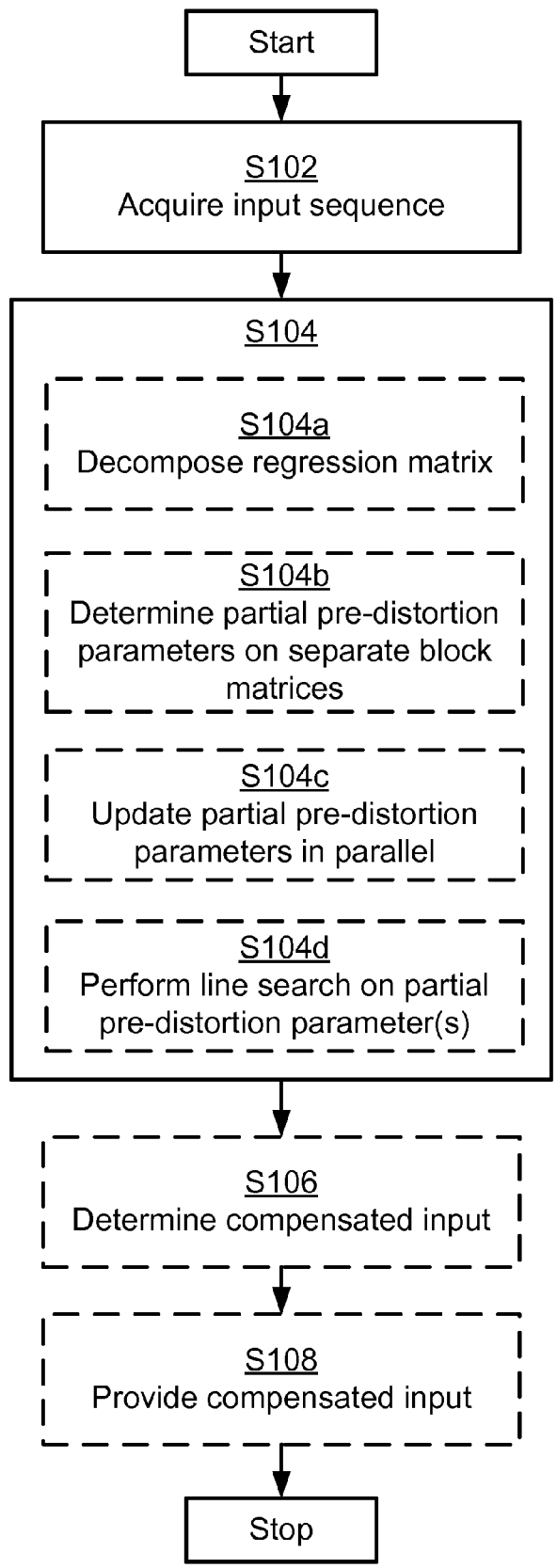

FIGS. 5 and 6 are flow charts illustrating embodiments of methods for compensating for non-linearity in a radio frequency power amplifier. The methods are performed by the pre-distorter 12. The methods are advantageously provided as computer programs 42. FIG. 4 shows one example of a computer program product 41 comprising computer readable means 43. On this computer readable means 43, a computer program 42 can be stored, which computer program 42 can cause the processing unit 22 and thereto operatively coupled entities and devices, such as the storage medium 24 and the communications interface 23 to execute methods according to embodiments described herein. The computer program 42 and/or computer program product 41 may thus provide means for performing any steps as herein disclosed.

In the example of FIG. 4, the computer program product 41 is illustrated as an optical disc, such as a CD (compact disc) or a DVD (digital versatile disc) or a Blu-Ray disc. The computer program product 41 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory. Thus, while the computer program 42 is here schematically shown as a track on the depicted optical disk, the computer program 42 can be stored in any way which is suitable for the computer program product 43.

With general references to FIGS. 2a, 2b, 3, and 5 a method for compensating for non-linearity in a radio frequency power amplifier (RFPA) 31 as performed by a pre-distorter 12 will now be disclosed. In general terms, the enclosed embodiments relate to improvements of the numerical modeling accuracy of the pre-distorter 12 as well as to provide a setting for variable adaptation speed aimed at adapting selected parts of the model at rates of choice. The processing unit 22 of the pre-distorter 12 is arranged to, in a step S102, acquire an input sequence x. The acquiring may be performed by executing functionality of the acquiring unit 22a. The computer program 42 and/or computer program product 41 may thus provide means for this acquiring. Permutations of the input sequence x are stored in a regression matrix H. The processing unit 22 of the pre-distorter 12 is arranged to, in a step S104, determine a pre-distortion parameter θ based on the input sequence. The determining may be performed by executing functionality of the determining unit 22b. The computer program 42 and/or computer program product 41 may thus provide means for this determining. The pre-distortion parameter is based on a block matrix pseudo-inverse $H^+$ of the regression matrix H. As noted above, the RFPA may be modelled as $$y = H\theta + w,$$

where H is the N-by-M basis regression matrix which consists of permutations on the input x, θ is the M-by-1 model coefficient vector, y is the N-by-1 vector containing the output samples and w is the N-by-1 observation noise vector. By taking advantage of the linear parameterization and decomposing this otherwise large problem in a linear matter, into several smaller sub-problems, as $$y = H\theta + w = \sum_i H_i \theta_i + w,$$

it is possible to use a block matrix pseudo inverse approach to identify and update each sub-coefficient vector $\theta_i$ in parallel. Particularly, the regression matrix H is decomposed into at least two block matrices $H_1, H_2$ based on at least one physical property of the RFPA 31. Hence the models ability to separately describe the types of behavior inflicted by the RFPA may be considered in order to reduce the dimensionality of the problem.

Once the pre-distortion parameter θ has been generated the pre-distorter 12 may determine a compensated RFPA input sequence x'. The compensated RFPA input sequence x' may also be regarded as a pre-distorted sequence. Particularly, the processing unit 22 of the pre-distorter 12 may be arranged to, in an optional step S106, determine a compensated RFPA input sequence x' by subjecting the input sequence x to the pre-distortion parameter θ. The determining may be performed by executing functionality of the determining unit 22b. The computer program 42 and/or computer program product 41 may thus provide means for this determining. The processing unit 22 of the pre-distorter 12 may then be arranged to, in an optional step S108, provide the compensated RFPA input sequence x' as input to the RFPA 31. The providing may be performed by executing functionality of the providing unit 22c. The computer program 42 and/or computer program product 41 may thus provide means for this providing. This is schematically illustrated in FIG. 3, which also illustrates the output y as generated by the RFPA 31. Hence, the non-linearity of the RFPA 31 may be identified by observing the output y and knowing x. Further details in relation to this will be disclosed below.

The input sequence x may be a modulated baseband signal. The modulated baseband signal may be a complex baseband representation of a RF passband signal.

Embodiments relating to further details of compensating for nonlinear effects caused by an RFPA 31 will now be disclosed. Reference is generally made to FIGS. 2a, 2b, 3, and 6. There may be different physical properties of the RFPA 31 to consider. Different embodiments relating thereto will now be described in turn.

For example, the regression matrix may be decomposed into at least two block matrices $H_1, H_2$ based on static effects of the RFPA 31. In general terms, the static behavior of the RFPA determines the general trend of the input-output relation by means of, for example, the compression point.

For example, the regression matrix may be decomposed into at least two block matrices $H_1, H_2$ based on dynamic or short term memory effects of the RFPA 31. In general terms, these effects represent signal degeneration caused by memory effects, which will manifest itself as a time varying, signal history dependent and nonlinear input-to-output relation.

For example, the regression matrix may be decomposed into at least two block matrices $H_1, H_2$ based on long term memory effects of the RFPA 31. In general terms, these effects represent memory effects with large time-constants caused by for example thermal variations, charging and discharging of electron traps, etc.

For example, the regression matrix may be decomposed into at least two block matrices $H_1, H_2$ based on numerical conditioning effects of the RFPA 31. In general terms, due to high dimensionality and long sample records, the condition number will grow, causing the numerical solution to suffer in terms of accuracy and stability.

For example, the regression matrix may be decomposed into at least two block matrices $H_1, H_2$ based on further effects of the RFPA 31. Examples of such further effects include, but are not limited to, effects stemming from multiple frequency band operation, and effects caused by multiple antenna operation, in which $H_1$ and $H_2$ may model two different RFPAs and their interaction.

That is, according to embodiments, the at least one physical property of the RFPA 31 relates to at least one effect from a group of static effects, dynamic or short term memory effects, long term memory effects, frequency band effects, number of antenna outputs effects, and numerical conditioning effects caused by the non-linearity of the RFPA 31.

Further, according to Dynamic Deviation Reduction (DDR) Volterra series, the regression matrix H may be divided into a static and a dynamic part. This may be written as $$y = H\theta + w = [H_s \ H_d] \cdot \begin{bmatrix} \theta_s \\ \theta_d \end{bmatrix} = H_s \theta_s + H_d \theta_d.$$

Hence, according to an embodiment $H_1 = H_s$, and $H_2 = H_d$, or vice versa. Thus according to an embodiment the pre-distortion parameter θ comprises at least two partial pre-distortion parameters $\theta_i$. According to an embodiment the processing unit 22 of the pre-distorter 12 is thus arranged to, in an optional step S104b, determine the pre-distortion parameter θ by determining each partial pre-distortion parameter $\theta_i$ based on a separate one $H_i$ of the at least two block matrices. The determining may be performed by executing functionality of the determining unit 22b. The computer program 42 and/or computer program product 41 may thus provide means for this determining. Each of the sub-matrix $H_i$ of the regression matrix H will have reduced dimensionality compared to H, which will lead to a more stable and accurate estimate. Hence, according to an embodiment, determining the pre-distortion parameter is based on a linear parameterization of the non-linearity of the RFPA 31 (i.e., of the nonlinear RFPA model).

Although some of the embodiments below are presented for $H=[H_1 H_2]$, the skilled person would understand how to divide H into more than two parts.

An embodiment of the identification procedure in the two dimensional case, e.g. where the model is decomposed into two parts, will now be disclosed. Assuming that the model is decomposed into two parts, the modeled output may be written as $$\bar{y} = H_1 \theta_1 + H_2 \theta_2.$$

From this, it is possible to identify the model parameter $\theta$ using the block matrix inverse theorem as follows:

$$\theta = [H_1 \quad H_2]^+ y = \begin{bmatrix} (P_1^\perp H_2)^+ \\ (P_2^\perp H_1)^+ \end{bmatrix} y.$$

Here, the orthogonal projection matrices are defined as $$P_n^\perp = I - H_n (H_n^T H_n)^{-1} H_n^T,$$

where n=1 or 2. Each subset of coefficients $\theta_i$ for i=1, 2, can now be found by inverting each block separately. That is:

$$\begin{cases} \theta_1 = (P_2^\perp H_1)^+ \bar{y} \\ \theta_2 = (P_1^\perp H_2)^+ \bar{y}. \end{cases}$$

By following this procedure, the sub-set of parameters $\theta_i$ may be identified by solving two numerical problems with significantly lower dimension in comparison to solving one single numerical problem yielding $\theta$, thus increasing the accuracy of the final estimate.

In general terms, the benefit of decomposing the basis matrix H increases with number of parameters, length of data record and basis function selection since as more columns are added, the numerical problem at hand will be more ill conditioned to solve.

There may also be several ways to perform the decomposition, i.e. to determine how to divide H into $H_1$ and $H_2$, respectively. As noted above, the regression matrix H is decomposed into at least two block matrices $H_1$, $H_2$ based on at least one physical property of the RFPA 31. Examples of such physical properties of the RFPA 31 have also been provided above.

One way to perform the decomposition based on the physical property of numerical conditioning effects caused by the non-linearity of the RFPA 31 is to minimize the average condition number of the two elements in the basis function block-matrix.

Let H be an N-by-M matrix, where N>>M (i.e., H is a tall matrix). According to the above, H may be expressed as a block-matrix:

$$H = [H_1 H_2],$$

where H is now partitioned at index 1<k<M as $$\begin{cases} H_1 = H_{[N \times 1:k]} \\ H_2 = H_{[N \times k+1:M]}. \end{cases}$$

Thus, by varying the index k at which the partitioning is done, the condition number for each sub-problem (i.e., for each $H_1$) can be examined and the best trade-off in terms of an (weighted) average condition number $$\kappa_{Avg}(k) = \frac{\kappa(H_{[N \times 1:k]}) + \kappa(H_{[N \times k+1:M]})}{2}$$

may be found.

Figure 7:
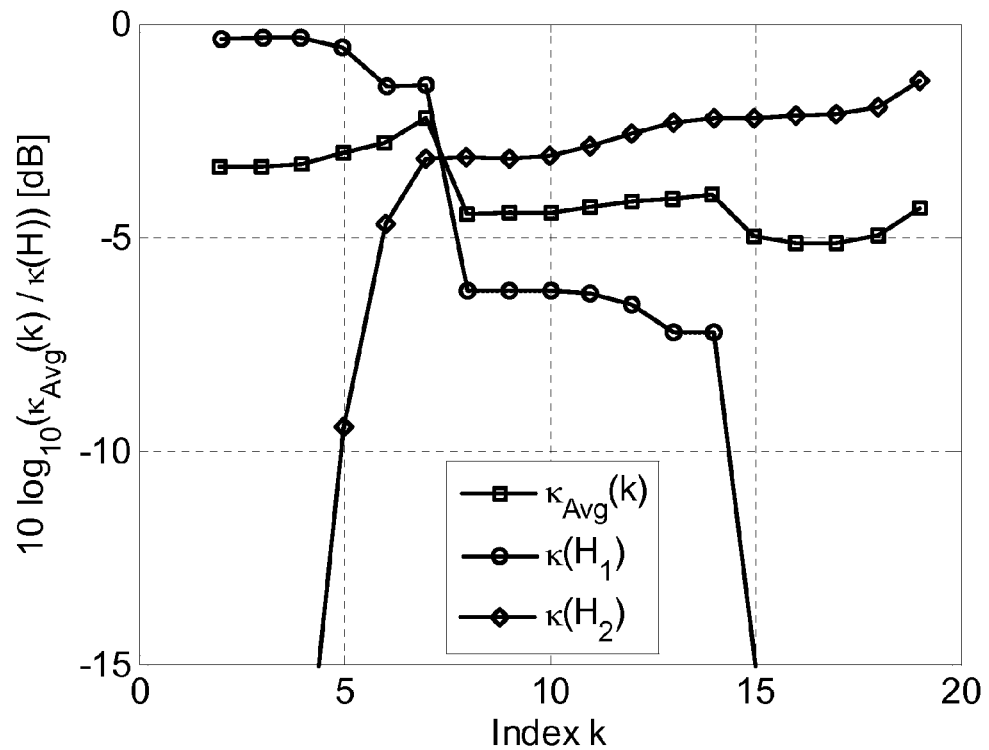
FIG. 7 schematically illustrates the average condition number versus partitioning index k according to an embodiment.

One example on the average condition number versus partition index k is show in FIG. 7, in which polynomial basis functions are used.

The pre-distortion parameter $\theta$ may additionally and/or alternatively be found by combining at least two physical properties of the RFPA 31. According to an embodiment the processing unit 22 of the pre-distorter 12 is thus arranged to, in an optional step S104a, determine the pre-distortion parameter $\theta$ by decomposing the regression matrix H into the at least two block matrices $H_1$ and $H_2$ based on a weighted average of at least two of the effects. The decomposing may be performed by executing functionality of the decomposing unit 22d. The computer program 42 and/or computer program product 41 may thus provide means for this decomposing.

There may be different ways to determine each partial pre-distortion parameter $\theta_i$. Different embodiments relating thereto will now be described in turn.

For example, the block-size and/or update-rate associated with the determination of each partial pre-distortion parameter $\theta_i$ may be different. For example, if H is divided into two parts, one representing static nonlinearities and one part representing dynamic nonlinearities, i.e., where $H_1 = H_s$ and $H_2 = H_d$, or vice versa, each $H_i$ may have its own sample block-size and/or coefficient update-rate. This is because these inherent physical properties have different time-constants. That is, the Gauss-Newton-step (GNS) may for each $\theta_i$ may be expressed as $$\begin{cases} \theta_1^{(n+1)} = \theta_1^{(n)} + \mu_1 (P_2^\perp H_1)^+ (x - y) \\ \theta_2^{(n+1)} = \theta_2^{(n)} + \mu_2 (P_1^\perp H_2)^+ (x - y), \end{cases}$$

where n is the index of the current value of $\theta_i$ and n+1 is the index of the updated value of $\theta_i$. Each partial pre-distortion parameter $\theta_i$ may thus be associated with a unique step-size value $\mu_i$.

Figure 8:
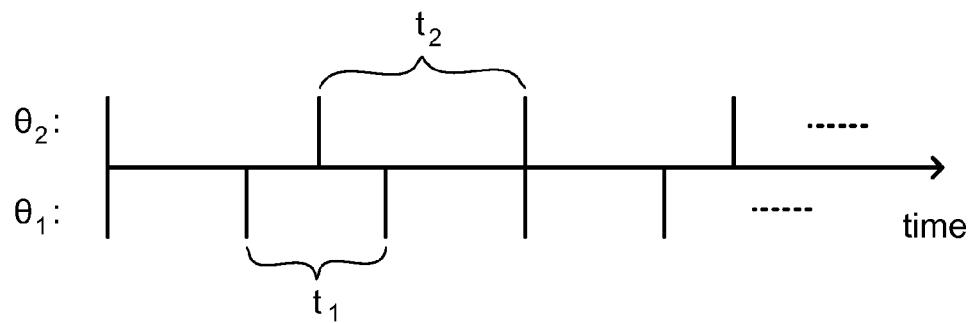
FIG. 8 schematically illustrates scheduling of updating of pre-distortion parameters.

Since the GNS may be performed on the different parameter sets $\theta_i$ independently, the time-wise updating interval at which each coefficient set $\theta_i$ is adapted may also be different for each coefficient set $\theta_i$, as illustrated in FIG. 8. Thus, according to an embodiment each partial pre-distortion parameter $\theta_i$ is associated with a unique time-wise updating interval $t_i$. FIG. 8 schematically illustrates scheduling of updating of two pre-distortion parameters $\theta_1$ and $\theta_2$. According to FIG. 8, the parameter $\theta_1$ is updated at a first time interval $t_1$, whilst the parameter $\theta_2$ is updated at a second time interval $t_2$. In the illustrative example of FIG. 8 $t_1 < t_2$. This could represent a case where $\theta_1$ is associated with short-term effects whilst $\theta_2$ is associated with long-term effects.

Further, since each $\theta_i$ may be determined independent from another $\theta_j$, where $i \neq j$, the $\theta_i$ may be determined in parallel. Thus, according to an embodiment the processing unit 22 of the pre-distorter 12 is arranged to, in an optional step S104c, determine the pre-distortion parameter $\theta$ by updating the at least two partial pre-distortion parameters $\theta_i$ in parallel. The updating may be performed by executing functionality of the updating unit 22e. The computer program 42 and/or computer program product 41 may thus provide means for this updating.

Line-search algorithms (which may be separate) may also be applied in order to guarantee that the GNS will not pass the minima. Further on, since there is no requirement that $\mu_i = \mu_j$ for $i \neq j$, the line-search can be performed separately on the parameter-sets $\theta_i$. According to an embodiment the processing unit 22 of the pre-distorter 12 is thus arranged to, in an optional step S104d, perform line search on at least one of the partial pre-distortion parameters $\theta_i$. The line searching may be performed by executing functionality of the line searching unit 22f. The computer program 42 and/or computer program product 41 may thus provide means for this line searching.

Further on, each sub-problem (i.e., the determination of each $\theta_i$) may have a less number of local minima, than the problem of determining $\theta$ directly from one single regression matrix H.

As noted above, the herein disclosed embodiments are not limited to decomposing the regression matrix into only two block matrices. For example, a 4-dimensional model could take diverse effects such as thermal variations (Th), drain- and gate-lag (DL and GL) due to trapping for a Gallium Nitride (GaN) high electron mobility transistor (HEMT) into consideration. Hence the output y from the RFPA 31 may be expressed as:

$$y = H_x \theta_0 + H_{Th} \theta_{Th} + H_{DL} \theta_{DL} + H_{GL} \theta_{GL}.$$

The four different basis matrices may contain combinations of the input x, or nonlinear functions of x, and as such they may need adaptation at different rates. Since the block-matrix approach may be to identify and adapt the different coefficient sets in parallel, the update rate for each part of the model may be tailored by its need, depending on the time-constants of the RFPA 31 being short or long term.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

What is claimed is:

1. A method for compensating for non-linearity in a radio frequency power amplifier (RFPA) the method being performed by a pre-distorter, the method comprising:
   acquiring an input sequence; and
   determining a pre-distortion parameter based on the input sequence;
   wherein the pre-distortion parameter is based on a block matrix pseudo-inverse of a regression matrix comprising permutations of the input sequence; and
   wherein the regression matrix is decomposed into at least two block matrices based on at least one physical property of the RFPA.

2. The method of claim 1, further comprising:
   determining a compensated RFPA input sequence by subjecting the input sequence to the pre-distortion parameter; and
   providing the compensated RFPA input sequence as input to the RFPA.

3. The method of claim 1, wherein the at least one physical property of the RFPA relates to at least one effect from a group of static effects, dynamic or short term memory effects, long term memory effects, frequency band effects, number of antenna outputs effects, and numerical conditioning effects caused by the non-linearity of the RFPA.

4. The method of claim 3, wherein determining the pre-distortion parameter further comprises decomposing the regression matrix into the at least two block matrices based on a weighted average of at least two of said effects.

5. The method of claim 1, wherein the pre-distortion parameter comprises at least two partial pre-distortion parameters, and wherein determining the pre-distortion parameter further comprises determining each partial pre-distortion parameter based on a separate one of the at least two block matrices.

6. The method of claim 5, wherein determining the pre-distortion parameter further comprises updating the at least two partial pre-distortion parameters in parallel.

7. The method of claim 5, wherein each partial pre-distortion parameter is associated with a unique step-size value.

8. The method of claim 5, further comprising performing line search on at least one of the partial pre-distortion parameters.

9. The method of claim 5, wherein each partial pre-distortion parameter is associated with a unique time-wise updating interval.

10. The method of claim 1, wherein determining the pre-distortion parameter is based on a linear parameterization of the non-linearity of the RFPA.

11. The method of claim 1, wherein the input sequence is a modulated baseband signal.

12. A pre-distorter for compensating for non-linearity in a radio frequency power amplifier (RFPA) the pre-distorter comprising a processing circuit, the processing circuit being arranged to:
   acquire an input sequence; and
   determine a pre-distortion parameter based on the input sequence;
   wherein the pre-distortion parameter is based on a block matrix pseudo-inverse of a regression matrix comprising permutations of the input sequence; and
   wherein the regression matrix is decomposed into at least two block matrices based on at least one physical property of the RFPA.

13. A network node comprising a pre-distorter of claim 12 and an RFPA, wherein an output of the pre-distorter is operatively connected to an input of the RFPA.

14. A non-transitory computer-readable medium comprising, stored thereupon, a computer program for compensating for non-linearity in a radio frequency power amplifier (RFPA), the computer program comprising computer program code that, when run on a pre-distorter, causes the pre-distorter to:
   acquire an input sequence; and
   determine a pre-distortion parameter based on the input sequence;
   wherein the pre-distortion parameter is based on a block matrix pseudo-inverse of a regression matrix comprising permutations of the input sequence; and
   wherein the regression matrix is decomposed into at least two block matrices based on at least one physical property of the RFPA.

* * * * *